United States Patent

Aipperspach et al.

[11] Patent Number: 5,166,552
[45] Date of Patent: Nov. 24, 1992

[54] MULTI-EMITTER BICMOS LOGIC CIRCUIT FAMILY WITH SUPERIOR PERFORMANCE

[75] Inventors: Anthony G. Aipperspach, Rochester, Minn.; Gerard Boudon, Mennecy, France; Allan H. Dansky, Poughkeepsie, N.Y.; Pierre Mollier, Boissise Le Roi; Ieng Ong, Anthony, both of France; Nghia Phan, Rochester, Minn.; Biagio Pluchino, Poughkeepsie, N.Y.; Steven J. Zier, Hopewell Junction, N.Y.; Adrian Zuckerman, Poughkeepsie, N.Y.

[73] Assignee: International Business Machines Corporation, Armonk, N.Y.

[21] Appl. No.: 659,404

[22] PCT Filed: Feb. 22, 1988

[86] PCT No.: PCT/US88/00485
§ 371 Date: Mar. 8, 1991
§ 102(e) Date: Mar. 8, 1991

[87] PCT Pub. No.: WO89/05547
PCT Pub. Date: Jun. 15, 1989

[30] Foreign Application Priority Data
Dec. 1, 1987 [FR] France .................. 87 480020

[51] Int. Cl.⁵ .............................................. H03K 17/04
[52] U.S. Cl. ...................................... 307/446; 307/455
[58] Field of Search .............. 307/443, 446, 455, 570, 307/270

[56] References Cited

U.S. PATENT DOCUMENTS

| | | | |
|---|---|---|---|
| 4,103,188 | 7/1978 | Monton .................. | 307/446 X |
| 4,558,234 | 12/1985 | Suzuki et al. ............ | 307/446 |
| 4,616,146 | 10/1986 | Lee et al. ............... | 307/446 |
| 4,694,202 | 9/1987 | Iwamura et al. .......... | 307/446 |
| 4,694,203 | 9/1987 | Uragani et al. .......... | 307/446 |
| 4,701,642 | 10/1987 | Pricer ................... | 307/446 |
| 4,703,203 | 10/1987 | Gallup et al. ........... | 307/446 |

Primary Examiner—David Hudspeth
Attorney, Agent, or Firm—Charles W. Peterson, Jr.; Donald M. Boles; Otho Ross

[57] ABSTRACT

A multi emitter multi input BICMOS NAND circuit (30) is provided wherein an output node OUT connected to an output terminal (33) is coupled between pull up (31) and pull down (32) blocks. According to one embodiment of the present invention, the pull up block (32) is comprised of a plurality of identical basic cells, each comprised of a CMOS inverter (C31, C32) driving an NPN pull up transistor (T31, T32) mounted as an emitter follower. Logic signals (A31, A32) are applied on the inputs of the inverters (C31, C32), and the inverted signal (A31, A32) is available at the emitter of the emitter follower which corresponds to the output of the cell. All outputs are tied altogether to perform an OR function and are connected to said output terminal (33) to have a multi emitter like circuit. The pull down block (32) in this embodiment is comprised of 2 FETs (F31, F32) serially connected between said output node OUT and a discharge device such as a feedback NFET (Z) the gate of which is connected to said output node OUT. These 2 FETs are for driving a NPN pull down transistor (T), the collector of which is also connected to the output node OUT. The invention includes a number of other embodiments including a feedback inverter embodiment, a parasitic node discharge embodiment, and a BIFET latch embodiment.

43 Claims, 6 Drawing Sheets

MULTI-EMITTER BICMOS LOGIC CIRCUIT FAMILY WITH SUPERIOR PERFORMANCE

BACKGROUND OF THE INVENTION

The present invention relates in general to BICMOS logic circuits (bipolar and CMOS circuitry on the same chip), and more particularly to a new family of logic circuits with improved power delay product while still maintaining the low power dissipation, high input impedance and the high noise immunity of the CMOS devices on the one hand, and the high drive capabilities of the bipolar devices on the other hand.

Several BICMOS circuits have been described in the literature. All of these circuits work on the same principle: bipolar transistors operate as a push-pull current booster, while Field Effect Transistors (NFET's and PFET's) are intended to constitute logic functions and to drive the base current of the bipolar transistors. In other words, in an optimized circuit designed to obtain the best use of both bipolar and unipolar technologies, FET's are used for logic implementation, and bipolar transistors for load driving.

Examples of such optimized circuits, are given in the following references:

Ref. 1: "How Motorola Moved BIMOS Up To The VLSI Levels," Electronics, Jul. 10, 1986, pp. 67-70.

Ref. 2: "CMOS/Bipolar Circuits for 60 MHz Digital Processing" by T. Hotta et al, IEEE Journal of SSC, Vol. SC-21 No. 5, October 1986, pp. 808-813.

Ref 3. "A Subnanosecond BI-CMOS Gate Array Family" by H. Nakashiba et al, IEEE 1986, Custom Integrated Circuits Conference, pp. 63-66.

Figure 1A:
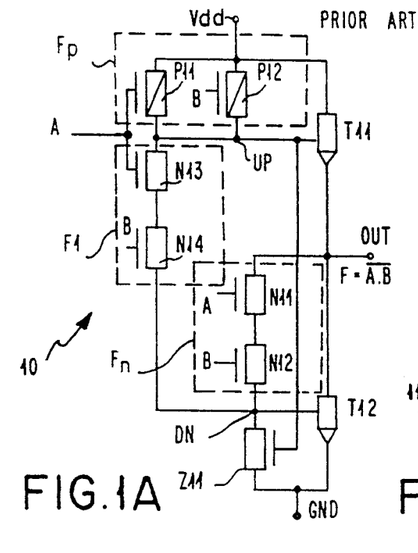
FIGS. 1A and 1B show schematic known implementations, of a two-input NAND gate circuit of the prior art in BICMOS technology.
Figure 1B:
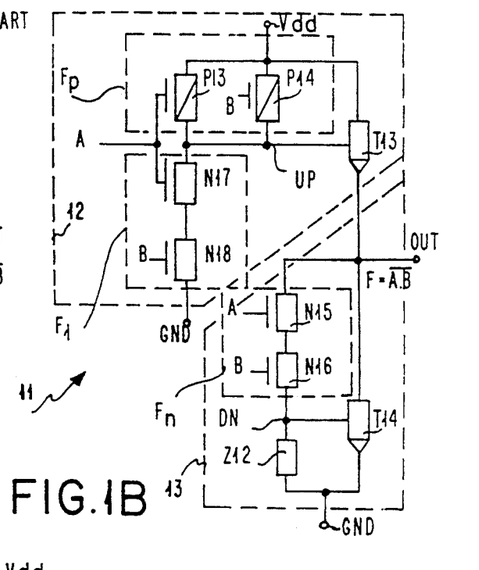

FIGS. 1A and 1B of the present application depict two known BICMOS NAND gate circuits as published in references 1 and 2 respectively.

FIG. 1A shows a standard implementation of a two input BICMOS NAND gate circuit referenced 10, with FET and bipolar devices, as illustrated in FIG. 3 of Ref 1.

From FIG. 1A, it may be understood that the logic block Fp is built with PFET's P11 and P12. Fp and Fn provide the base current to NPN transistors T11 and T12, respectively, when these transistors are turned on. T11 and T12 are the pull-up and pull-down transistors respectively of the gate circuit, and act as the driving devices for the next stages The common node between emitter of T11 and collector of T12 is the output node referenced OUT and is connected to the output terminal where the logic function F performed by the gate circuit is available.

To cut off T11, electric charges stored at the node UP must be evacuated. This discharge is controlled by the logic block F1 comprised of N13 and N14, similar to Fn. However, it is to be noted, that the discharge can also be done through a resistor (such as referenced Z in Ref. 3).

For the same reason, to cut off T12, node DN is discharged by a discharge device Z11 such as a feedback NFET, the gate of which is tied to the UP node (it might be connected to the OUT node as well). Node DN might also be discharged by a resistor (such as referenced Z in Ref 3).

The logical operation of the NAND gate circuit shown in FIG. 1A may be explained as follows When input A or B (or both) is "low" ('0' logic), the node UP is set at the same voltage as Vdd by PFETs, T11 is turned on, while T12 is cut off because of the "off" state of the two NFETs, so that output OUT is set to "high" ('1' logic).

When inputs A and B are both "high", none of PFETs is conducting, T11 is off, while T12 is turned on by the NFETs Output OUT is set to "low".

Now, let input A (or B) go from "high" to "low", the other one staying "high", one of PFETs P11 (or P12) will turn on T11, while the T12 base is no longer biased into conduction because N11 (or N12) is set to the off state. Therefore, the output will go from "low" to "high". Accordingly the logic function f=A·B is available at output OUT.

FIG. 1B shows another embodiment of a two input BICMOS NAND gate circuit similar to the one shown in FIG. 2A of Ref. 2. The circuit of FIG. 1B referenced 11 has some similarities with circuit 10 of FIG. 1A. However, logic block F1 comprised of N17 and N18 is now connected to the ground instead of the DN node, and the discharge device Z12 is a resistor.

The capacitive load at the output node OUT is charged up or discharged with the NPN transistors T13 or T14 respectively. In short, the NPN transistors operate as a set of current boosters. In this circuit, the electric charges stored at the base nodes UP and DN flow out through the F1 block comprised of N 17 and N18 and the resistor Z12, respectively. This discharge contributes to speed-up and power-reduction by minimizing the time when the both NPN transistors are active. The logic operation is quite the same as explained above.

What should be noted is that the two input BICMOS NAND circuit of FIG. 1B may be understood as being comprised of both a pull up block 12 and a pull down block 13.

The pull down block 13 is comprised of N15, N16 and T14, whilst the pull up block 12 is comprised of N17, N18, P13, P14 and T13. These blocks are coupled at one point which is the output node OUT connected to the OUTPUT terminal where the logic function F is available.

In both cases shown in FIGS. 1A and 1B, a BICMOS NAND gate circuit has been chosen for the sake of simplicity. It exhibits high performance, low power consumption, and ease of configuration. According to the basic philosophy of the BICMOS technology, the circuit uses a pair of push-pull bipolar devices to provide the needed driving capability, while the low power requirements of CMOS are preserved because the circuit draws no D.C. current. These characteristics allow any CMOS circuit to be modified into a BICMOS structure. The bipolar push-pull devices isolate the CMOS circuits from the loading, so that unit load degradation is the same for all circuit functions. In addition, power dissipation is lower than in an equivalent bipolar circuit, and average power dissipation is even less than in an equivalent CMOS circuit.

One of the problems of this type of circuit is the relatively slow rising and falling signals at node UP, due to the use of heavily loaded FETs (one PFET and one NFET per logic input) connected to the pull up transistor in the emitter follower. When several inputs are used, the logic function that drives node UP is performed by several CMOS devices. For instance, the Fp and Fn blocks of a 4 way NAND will be composed of 4 PFET's in parallel and 4 NFET's in series. It is well known that such CMOS logic circuits have low rise and fall transitions: the greater the number of inputs, the slower the transitions. In addition to impacting the propagation delay, the increase of transition time when both NPN transistors are turned on, causes a crossover current which flows from Vdd to ground through said NPN transistors, thus power consumption increases. This phenomenon is a significant deficiency with submicron devices.

It is therefore a primary object of the present invention to provide a new family of BICMOS logic circuits, the speed performance of which does not degrade when the number of logic inputs increases.

It is still another object of the present invention to provide a new family of BICMOS logic circuits with quick charge or discharge at the UP node, to improve speed and reduce power consumption by minimizing the time when both NPN transistors are active.

It is still another object of the present invention to provide a new family of BICMOS logic circuits having reduced cross over currents when both NPN transistors are active.

SUMMARY OF THE INVENTION

In carrying out the above and other objects of the main embodiment of the present invention, there is provided a new family of n input BICMOS logic circuits comprising a pull up block and pull down block having an output node coupled therebetween. According to a preferred embodiment, the pull up block is comprised of n basic cells; each cell being implemented with a determining logic circuit driving an NPN pull up. transistor mounted as an emitter follower. Each determining logic circuit is biased between a positive voltage (Vdd) and a first reference voltage (Vref1). Logic inputs or signals Al to An are applied to the inputs of the determining logic circuit. Emitters of the NPN pull up transistors are tied together to provide an OR dotting and are connected to the output node where the logic function F is available. This particular implementation is the main feature of the present invention. In a preferred embodiment, the determining logic circuit comprises a CMOS inverter. As a result, the circuit which drives the NPN pull up transistor of the pull up block is no longer a slow CMOS logic functional circuit as practiced in the prior art. It has been replaced by fast CMOS inverters followed by fast bipolar transistors or circuits. Lightly loaded CMOS inverters are faster than complex CMOS logic circuits and the delay added due to bipolar OR dotting is negligible in this push-pull configuration.

In another preferred embodiment the determining logic circuit is selected among elementary logic functional circuits such as NOR, NAND, . . . etc.

The pull down block may be comprised of a NFETs, each receiving a logic input and being connected serially to form a stack mounted between a first and a second node. The first node is connected to a discharge device (such as an NFET) connected to a second reference voltage (Vref2) and to the base of an NPN pull down transistor. The collector of the NPN pull down transistor and the other node of the NFET stack are tied together and connected to the output terminal OUT. This implementation is standard. However, according to still another embodiment of the present invention, several pull down blocks may be paralleled.

The invention further includes a feedback inverter embodiment, a parasitic node discharge embodiment, and a BIFET latch embodiment.

DETAILED DESCRIPTION OF THE PREFERRED EMBODIMENT

The basic principle of the present invention may be understood from the following study, which is given with respect to an n input NAND gate circuit only for illustrating a preferred embodiment of the present invention.

Consider an n input (A1, . . . , An) NAND gate circuit and its related logic function F, where $$F = A1 \cdot A2 \cdot \ldots \cdot Ai \cdot \ldots \cdot An \qquad (1)$$

or written differently $$F = \overline{A1} + \overline{A2} + \ldots \overline{Ai} + \overline{An}. \qquad (2)$$

To implement such a function in BICMOS circuitry, equation (2) can be used to build the pull-up block of the n input NAND gate circuit according to the following scheme each cell is implemented with a CMOS inverter driving a NPN transistor. These 3 devices form a basic cell named "Inverted Emitter Follower" or IEF and may be symbolically represented by IEF=INVERT-·EF to express that the basic IEF cell is constituted by. an inverter driving an emitter follower. A logic input signal Ai applied on the circuit of cell IEFi, is therefore inverted, and the logic signal $\overline{Ai}$ is available at the output of the cell.

The pull-up block could be built by connecting all of these IEF cells to perform an "OR" function, between the logic outputs, thus performing the resulting logic function $F = A1 + A2 + \ldots + An$.

The pull-down block can be built according to equation (1) by connecting n FET's serially to drive a single NPN transistor. More generally, the circuit in the pull down block is the dual image of the logic circuit in the pull up block, as is well known to one skilled in the art.

Figure 2:
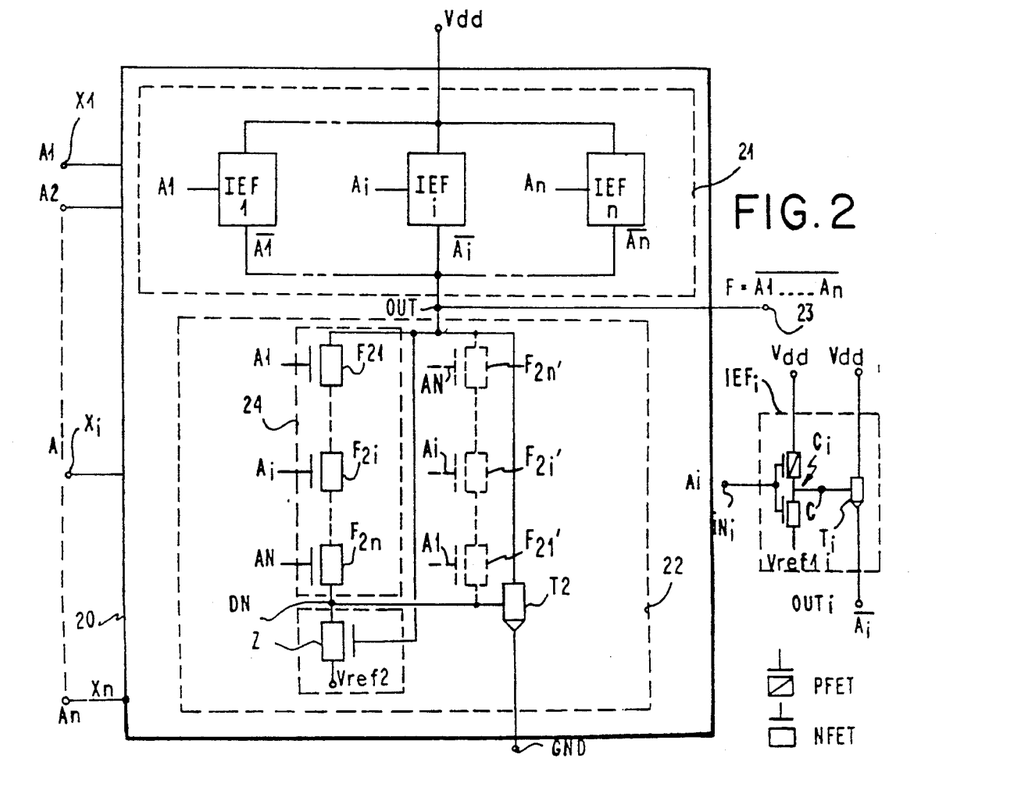
FIG. 2 shows the block diagram of an n input NAND BICMOS circuit according to a preferred embodiment to illustrate the basic principle of the present invention.

FIG. 2 shows the block diagram of such an n input NAND circuit implemented according to the preferred embodiment of the invention as explained above. The n input NAND circuit 20 is implemented by connecting in series the pull-up and pull-down blocks, respectively referenced 21 and 22, between a first power (voltage) supply (e.g. Vdd) and a second power (voltage) supply e.g. the ground: GND). The common node at the point of coupling is the output node OUT of the circuit Therefore a logic function F is available at the output node terminal referenced 23. Logic input signals $A1, \ldots, An$ are respectively applied to input terminals $X1, \ldots, Xn$ of circuit 20, then to appropriate input terminals of appropriate P and N type devices.

According to the basic principle of the present invention, pull up block 21 is comprised of n basic cells referenced IEF1 to IEFn. Each cell IEFi (i=1 to n) is comprised of a CMOS inverter Ci (formed of a pair of complementary FETs) driving an NPN pull up transistor Ti. The drain region of the PFET and the collector of Ti are connected to Vdd. The node which is common between the output of the inverter Ci and the base of the NPN transistor is referenced as the C node. The logic signal Ai is applied to the input terminal INi of the inverter Ci. Each logic signal Ai is inverted to control the base of transistor Ti. Transistor Ti is mounted as an emitter follower The terminal which corresponds to the emitter of Ti, and where $\overline{Ai}$ is available, is referred to as OUTi. The source region of the NFET of the CMOS inverter Ci can be grounded or connected to a reference voltage Vrefli In most, if not all applications, all reference voltages Vrefli (i=1 to n) will be identical and equal to Vrefl. Vrefl must be selected according to the following relation:

$$\text{Ground} < \text{Vrefl} < \text{Ground} + 2V_{BE}(Ti).$$

$V_{BE}(Ti)$ means the potential difference between the base and emitter of transistor Ti. As is clear from FIG. 2, all inverters Ci are connected between Vdd and Vrefl, and all emitters of transistors Ti are tied together to perform an OR dotting, and are connected to the output node OUT of the circuit. The circuit comprises a Multi Emitter structure.

The pull down block 22 may be comprised of n NFETs F21 and F2n serially connected between a first and a second node to drive a signal NPN pull down transistor T2. These n NFETs form a logic stack reference 24, which logic stack is the dual image of the circuit in the pull up block In addition, conduction of the logic stack is controlled by a discharge device Z connected to a second reference voltage Vref2. In a preferred embodiment, the discharge device Z is an NFET, with the gate electrode thereof connected to the output node out and with its source region connected to ground potential or to a second reference voltage Vref2, with a value chosen in accordance with the following expression:

$$\text{Ground} < \text{Vref2} < \text{Ground} + V_{BE}(T).$$

The first node of the logic stack (source region of F2n) is common to the base of the NPN transistor T2 and the drain region of the discharge NFET Z and is referenced the DOWN node or DN.

The second node of the stack (drain region of F21) is tied with the collector of T2 and connected to the output node OUT.

The pull-down circuit 22 may be modified, in a preferred embodiment, in order to improve the pull-down switching delay and to make the delay symmetric. In particular, it was noted that as more FET devices were added to the FET stack 24, the propagation delay from the input to the OUT node 23 became more and more dependent on the particular input line which caused the OUT node 23 to change its voltage level. In this regard, the propagation delay when A1 goes HIGH, measured from the input line A1 to the OUT node 23, (assuming that all of the other input terminals to the stack are already HIGH) is slower than the delay measured from the input terminal AN to the OUT node 23 (when AN goes HIGH). This difference in delays occurs because the impedance at the source of the FET F21 is much higher than the impedance at the source of FET F2N. Likewise, any change in the voltage at the gate of FET 2n is immediately capacitively coupled via FET 2n to its source, which, in turn, is connected to the base of bipolar transistor T2. It is transistor T2 which actually pulls down the OUT node 23. Accordingly, a change in voltage on input line AN is quickly coupled to the base of transistor T2, while a change in the voltage on input line A1 must propagate through a number of FET devices before its effect is felt at the base of transistor T2. This delay difference can be as high as 50% for a 4-way NAND circuit.

In order to eliminate this delay skew, an identical stack of device $F'_{2M}$, $F'_{2i}$, and $F_{21}'$ can be added to the pull-down circuit 22, but with the inputs thereto provided in reverse order relative to the $F_{21}$, $F_{2i}$, and $F_{2M}$ stack. This structure is illustrated by the dashed line device $F_{2n}'$, $F_{2i}'$, and $F_{21}'$, shown in FIG. 2. The AN input is the top input while the A1 input is the bottom input for this additional FET stack.

In essence, input A1 (when it goes HIGH) uses both devices $F_{21}$, and $F_{21}'$ to pull the OUT node 23 to a down voltage level. $F_{21}$ is a top input in a stack while $F_{21}'$ is a bottom input in a stack. The same situation occurs for input AN. Thus, the delay from input A1 to the OUT node 23 and the delay from input AN to the OUT node 23 are equal and the delay skew in the operation of the pull down circuit is eliminated.

As a result, the circuit which drives the pull up block is no longer a slow CMOS logic functional circuit. It has been replaced by fast CMOS inverters followed by fast bipolar transistors or circuits. Lightly loaded CMOS inverters are faster than complex CMOS logic circuits and the delay added due to bipolar OR dotting is negligible in this push-pull configuration.

Figure 3:
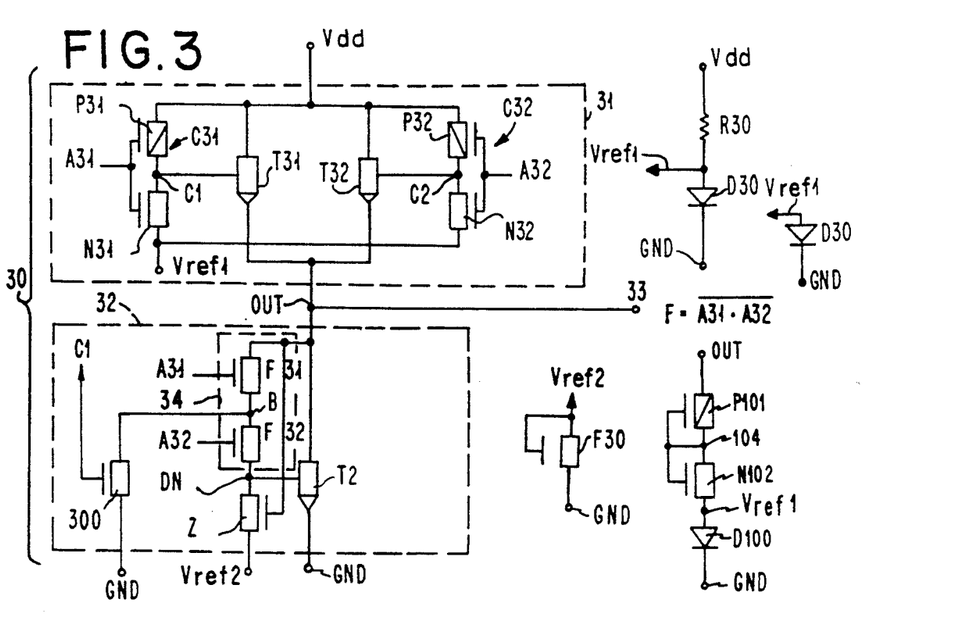
FIG. 3 shows the actual implementation of a two input BICMOS NAND circuit featuring a Multi emitter structure according to said preferred embodiment of FIG. 2 for improved speed performance and reduced power consumption. It also shows the use of a parasitic node discharge device.

As a specific example of the preferred embodiment shown in FIG. 2, FIG. 3 shows an implementation of a two input Multi Emitter NAND, referenced 30 and referred to hereafter as a MENAND. The pull-up block 31 of the MENAND is comprised of 2 IEF cells implemented with 2 CMOS inverters C31 (P31, N31) and C32 (P32, N32) driving respectively two NPN transistor T31 and T32. The reference voltages Vrefl and Vref2 are respectively implemented with a diode D30 or the combination of a resistor R30 and a diode D30 for the pull up block and a low threshold NFET F30 for the pull down block Because in certain logic configurations, T31 (or T32 or both) may have its base-emitter junction biased in reverse, which in turn may result in reliability problems, the role of diode D30 is to limit the reverse voltage, with the high value resistor R30 maintaining one $V_{BE}$ on the base of T31, while its emitter is at one $V_{BE}$ on the basis of T31, while its emitter is at one $V_{BE}$ below the power supply Vdd. For this reason this circuit operates at low power supply (e.g. 3.3 V) as defined by the new generation of CMOS circuits.

Alternatively, the reference voltage Vref1 for the pull up block 31 can be generated by connecting the Vref1 node to a reference potential such as ground potential by means of a diode D100. The Vref1 node is also connected to the OUT node via a set of series-connected FET diodes. For example, these series-connected FET diodes could comprise a plurality of series connected NFET diodes, or PFET diodes, or a combination thereof. In the embodiment shown in FIG. 3 the series-connected FET diodes are comprised of transistors P101 and N102. The gates for the NFET N102 and the PFET P101 are connected to a center node 104 between the series connected transistors P101 and 102. This transistor gate connection causes the transistors P101 and N102 to function as a variable resistance, with the resistance thereof being determined by the voltage difference between the OUT node and the Vref1 node. The greater this voltage difference, the lower the effective resistance value for the P101-N102 transistor configuration. This Vref1 configuration is preferred in some situations because it prevents the occurrence of current mirroring. In this regard, if Vref1 is disposed between the resistor R30 and the diode D30, with the resistor R30 connected to the voltage supply Vdd, then current mirroring can occur in the emitter follower pull-up bipolar transistors when all of the inputs are HIGH. In particular, because of the Vdd biasing connection, current always flows through the resistor R30 and the diode D30 to ground. Thus, the Vref1 will be held at approximately the diode voltage drop of 0.7-0.75 volts. When all of the inputs are HIGH so that the NFETs N31 and N32 are conducting, the voltage at the bipolar base nodes C1 and C2 becomes 0.7-0.75 volts. Accordingly, all of the bipolar emitter-follower transistors in the pull-up block (T31 and T32 in FIG. 3) conduct a current which mirrors the current flowing in the diode D30. Thus, there is a significant power loss caused not only by the current flowing through the resistor R30, to ground, but also by the current flowing from the bipolar emitter-follower transistors in the pull-up block 31 through the NFET stack in the pull-down block 32.

However, when Vref1 is connected to a reference potential via the diode D100, and diode D100 is biased via P101 and N102 connected to the OUT node, then this current mirroring effect does not occur. In particular, when all of the inputs are HIGH, then the OUT node is LOW so that there is almost no current flow through the biasing devices P101 and N102 and the diode D100. Accordingly, the Vref1 voltage is on the order of 0.1 volts. Since the NFETs N31 and N32 are conducting, the voltage at the bipolar emitter-follower base nodes C1 and C2 is approximately 0.1 volts. Thus, the bipolar emitter-follower transistors T31 and T32 in the pull-up block 31 do not conduct. Accordingly, the current mirror effect is eliminated and the power loss is minimized.

These series-connected FET diodes P101 and N102 also function to clamp the OUT node. In this regard, when the OUT node is high, a small current will feed the diode D100 through P101 and N102. This current flow ensures that the voltage at the node Vref1 is approximately 0.7 and that the voltage drop from the OUT node to Vref3 will never exceed 0.7V+2 times the FET Vt threshold.

In operation of FIG. 3, when both input signals A31 and A32 are "high", the output is "low" with F31, F32 and T2 conducting T31 and T32 are off with their bases biased near ground.

When either input A31 (or A32) is low, the output is high with T31 (or T32) conducting, while T2 is off with its base biased at the threshold of the N FET Z (e.g. 0.5 V). When both inputs are "low", the output is "high" with T31, T32 conducting, while T2 is off with its base biased at the threshold of Z.

When an input A31 (or A32) is "high", and the other A32 (or A31) switches from high to "low", T31 (or T32) remains off, T32 (or T31) will be turned on with its base biased to Vdd, while T2 will be cut off. Thus the output node OUT goes from "low" to "high" to perform the NAND function.

The speed improvement for this circuit can be understood as follows: The nodes that control the switching speed for the pull-up circuit are node C1 (the base terminal for the pull-up bipolar emitter-follower transistor T31), and node C2 (the base terminal for the pull-up bipolar emitter-follower transistor T32) When A31 is switched LOW so that P31 becomes conductive and begins to add charge to node C1 to raise the base voltage for the bipolar transistor T31, only two device capacitances (P31 and N31) must be charged up before the node C1 voltage begins to rise, regardless of the number of inputs to the multi-emitter pull-up circuit In contrast, for the prior art 2-input pull-up circuits shown in FIG. 1A, three device capacitances (P11, P12, N13) must be charged up before the node UP can rise in voltage to switch the OUT node up. Accordingly, the pull-up circuit takes longer to switch the OUT node up than the multi-emitter pull-up circuit of FIG. 3. The delay in raising the voltage at the base node of the bipolar pull-up transistor due to device capacitance connected to that node is progressively increased for each additional input PFET device added to the pull-up circuit of FIG. 1A.

In the situation where the input switches to a HIGH value to turn off the PFET P11 in FIG. 1A and to turn on the NFETs N13, N14, the charge at the base terminal UP node for the bipolar emitter-follower transistor T11 that is holding up the voltage of node UP must be removed to ground through three devices N13, N14, and Z11 (FIG. 1B requires removal through two devices N17 and N18). Each of these devices has a given resistance value to the current flow which impedes the speed of the charge flow and thereby the speed of the charge removal from the UP node. The total resistance seen by the charge during its removal to ground is increased for each additional input to the circuit, i.e., for each additional NFET added to the NFET stack.

In contrast, the pull-up circuit of FIG. 3 uses only one FET between the base node for each of the bipolar emitter-follower transistors and the reference potential to which the charge is dissipated. This single device between the bipolar base node and the reference potential does not change as more inputs are applied to the circuit. Rather, the circuit simply adds parallel-connected IEF cells. Accordingly, there is a significant switching speed difference during the pull-down operation between the circuit of FIG. 3 and the prior art circuits of the type shown in FIGS. 1A and 1B.

In essence, the output rise delay is reduced because each PFET (e.g. P31, . . . ) has to drive a very small capacitance, when the signal goes from "low" to "high" at C1 (or C2).

Likewise, the output fall delay is reduced, because the reduced amount of electric charge due to the small capacitances at node C1 (or C2) flows out rapidly through only one FET N31 (or N32) when signal goes from "high" to "low". Thus, that transition time is cut down, as well as the cross-over current, so that output goes rapidly from "high" to "low".

The diminuition of cross-over current reduces drastically the power consumption. Voltage references Vref1 and Vref2 permit the reduction of the signal swing at nodes C (C1, C2) and DOWN(DN), and therefore contribute significantly to improved switching speed at these nodes, which in turn, results in better circuit performance.

The input capacitance of the circuit is also reduced, because smaller NFETs and PFETs may be used to drive the pull-up NPN transistors (T31, . . . ). This also contributes to improved global performance of the circuit.

This new circuit featuring a Multi Emitter structure, offers several advantages.

It is very easy to extend the number of logic inputs of the present circuit to implement a 3, 4, 5 . . . etc. input MENAND. In addition, the delay increase due to the input count is much lower due to the use of the 2 emitter followers connected in parallel in the pull up block, as compared with conventional schemes.

For example, according to our simulations and for a given process, a 4 input NAND circuit in accordance with the invention, is 2 times faster than a traditional one, and power consumption is cut down by a factor of 4 times.

Although the NAND function fits well with the Multi Emitter concept, other and more complex functions can be implemented with the same concept. The basic principle of implementing a Multi Emitter structure as depicted above with respect to FIGS. 2 and 3, may be easily generalized to create an extended family of different logic circuits based on the Multi Emitter concept. For example, the basic IEF cell may be modified in different ways to provide other logic functions. This may be achieved simply by replacing the CMOS inverter by logic gates such as NAND, NOR, . . . etc. Generalizing the basic principle as explained with respect to FIGS. 2 and 3, implies that the logic circuit which drives each NPN pull up transistor T1 may have functions other than the INVERT function. The CMOS logic circuit which drives T1 will be called "a determining logic circuit" hereafter. In these implementations, the number of n cells may be different from the number of inputs. In addition, the logic stack may also be provided with a more complex arrangement so that it provides either independently or in combination with a modified pull up block, different and more complex logic functions.

Consider again equations (1) and (2). If each input Ai represents an m input OR function, F becomes an n×m input OR-AND-INVERT (OAI) function. This permits the generalization of the basic principle which is given with respect to FIGS. 2 and 3.

A yet further circuit may be added to the pull-down circuit to prevent parasitic capacitances in the FET stack (F31 and F32 in FIG. 3) from discharging through the base of the bipolar pull down transistor T2 and turning that transistor on. More particularly, with some sequences of input logic levels applied to the input terminals A31, A32, parasitic capacitance can charge up node B between the FETs F31 and F32. In the context of FIG. 3, such an input logic level sequence might be A31=1 and A32=0 with the OUT node at a high voltage. Node B becomes charged. Next A31 goes to 0, while A32 remains at 0. Thus, node B is in a high impedance state and the parasitic capacitances connected to this node remain charged. If the next set of logic input levels is A32=1, A31=0, then this built-up capacitance connected to node B will be discharged through NFET F32 to the base of the bipolar pull-down transistor T2. Because of the high gain for bipolar transistors, this unwanted charge flow will be amplified and will cause the bipolar transistor T2 to become momentarily conductive. Note that the emitter-follower pull-up circuit (P31, N31, T31) with A31=1 and P31 conductive, causes node C1 to remain HIGH, so that the OUT node is maintained at a HIGH level. However, a very high value current will flow from the bipolar emitter-follower T31 through the bipolar pull-down transistor T2. Accordingly, although the resulting voltage perturbation is very small due to the operation of the emitter-follower pull-up circuit (P31, N31, T31), a large current of up to 8 mA flows for up to several nanoseconds. This phenomenon causes significant unnecessary power consumption on the chip.

In order to avoid the problem, a circuit is connected to node B to discharge any built-up parasitic capacitances connected to that node as soon as the top FET F31 drops to a low potential, and before the bottom FET F32 can become conductive. This function is accomplished, in one embodiment, by connecting a transistor 300 between the node B and a low reference potential such as ground potential. The control terminal for this transistor is connected to an A31 circuit. In the embodiment shown in FIG. 3 using an NFET for the transistor 300, this connection is accomplished by connecting the gate of the NFET 300 to node C1.

In operation, with A31=1 and A32=0, node B charges up. When A31 switches to 0, and prior to A32 switching to 1, NFET 300 becomes conductive while node B is in its high impedance state. Thus, NFET 300 effectively discharges node B before F32 is turned on, drastically reducing current glitches in the circuit.

This parasitic capacitance discharge circuit can be used in a wide variety of different logic pull-down circuits, including logic circuits with 3 or more inputs. The discharge of the nodes between series stacks of three or more FETs in a pull-down logic circuit can be accomplished simply by connecting the NFET 300 to one or a plurality of these nodes and then connecting the gate of NFET 300 to the inverse of one or a plurality of the inputs applied to FETs that are above the last node in the pull-down stack that is to be discharged.

Figure 4:
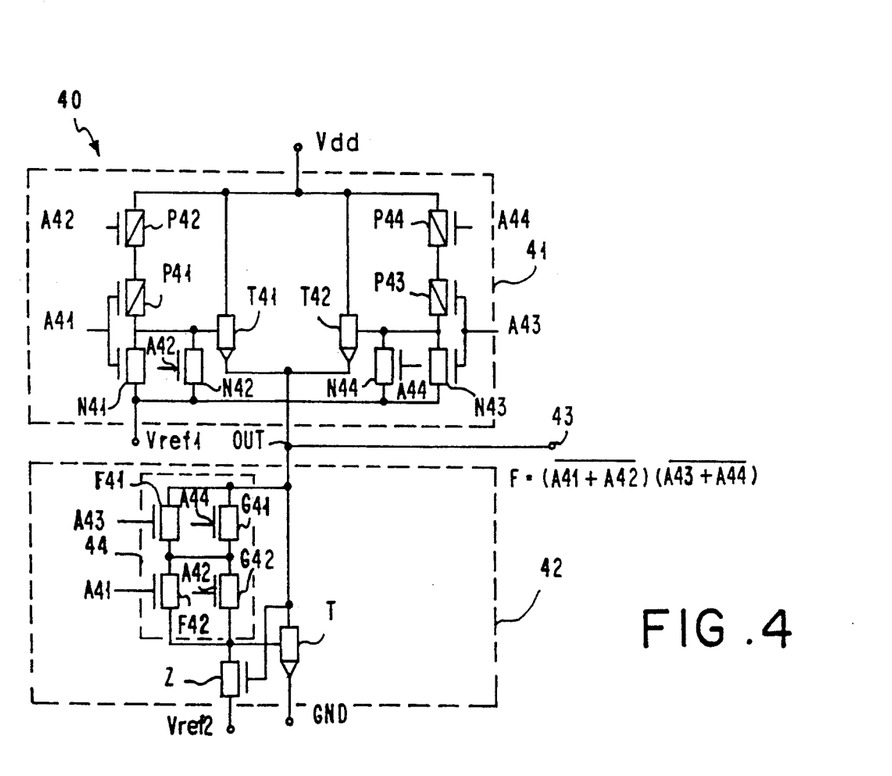
FIG. 4 shows the implementation of a 2×2 input Multi Emitter BICMOS OAI circuit according to another embodiment of the present invention.

FIG. 4 shows a 2×2 input Multi-Emitter OAI circuit according to another embodiment of the present invention. Turning to FIG. 4, there is shown an OAI circuit 40, wherein in the pull up block 41, the basic IEF cells have been made more complex, by performing a NOR function, and not just an INVERT function. In other words, using the same symbolic wording used above, this function can be expressed as IEF=NOR.EF. All of the logic inputs such as A41, A42 are OR dotted at the output node OUT to provide a logic function F=(A42·A42)+(A43·A44) on the output terminal 43. The logic stack in the pull down block, is modified to have the appropriate serial/parallel connection. The function of this circuit is equivalent to two input NOR and two input NAND circuits serially connected.

Figure 5:
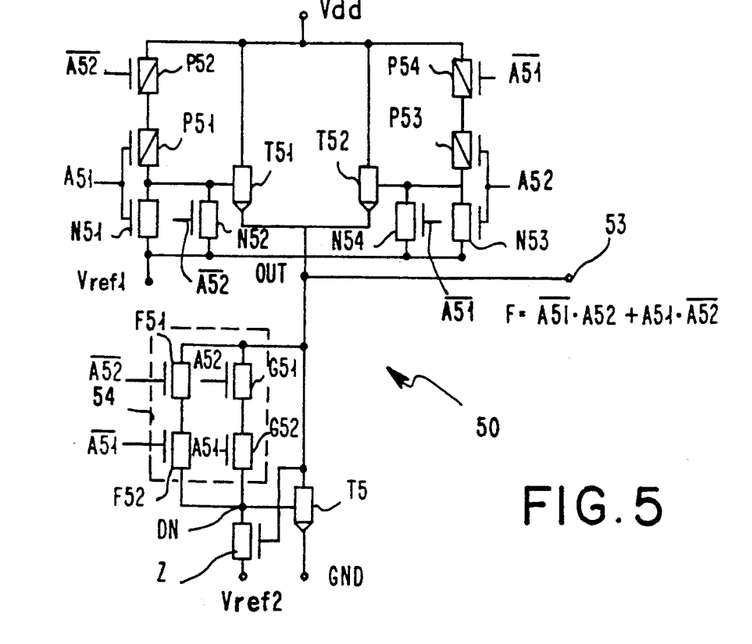
FIGS. 5 and 6 respectively show the implementation of a Multi Emitter XOR and a high density Multi Emitter 4 input NAND BICMOS circuit according to another embodiment of the present invention.

FIG. 5 shows a Multi-Emitter XOR circuit where complementary logic inputs (e.g. A52) are provided by additional CMOS inverters (not represented). The same principles as explained above with respect to the embodiment of FIG. 4, are used again in the circuit 50 of FIG. 5, except in the logic stack 52. A parallel connection is completed to perform the desired function. In the present case IEF=NAND.EF (F51, F52 in parallel with G51, G52). This allows the performance of an XOR function so that F=A51. A52+A51.A52. The function of this circuit is equivalent to that of two input OR-AND and two input NAND circuits serially connected. Note that parallel-connected pull-down FET stacks are used in the pull-down circuit to eliminate the pull-down switching delay skew referred to with respect to FIG. 2.

Figure 6:
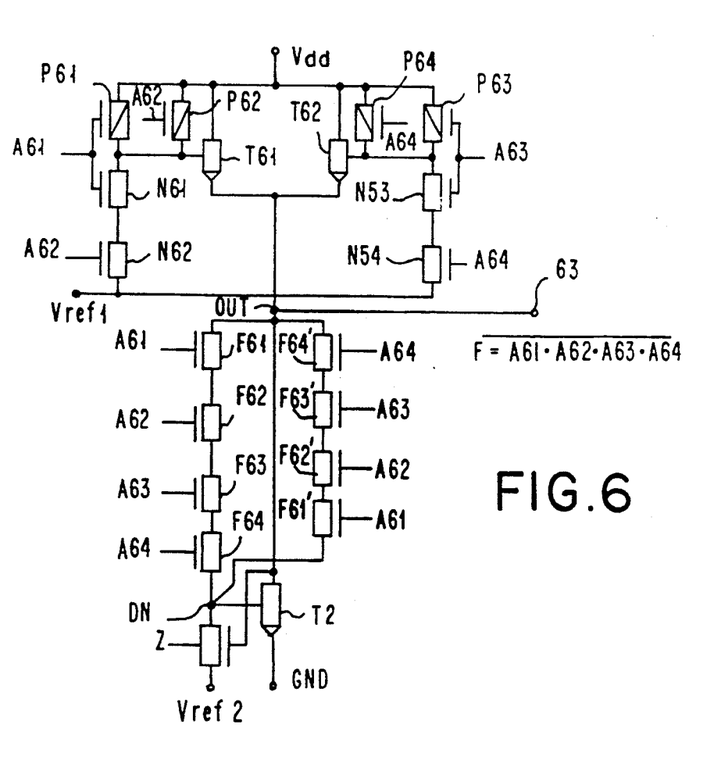

Using the same concept as described above with respect to Multi-Emitter complex functions, a high density version of Multi-Emitter NAND circuit may be derived. If very high speed is not required, an n input NAND circuit can be built with n/2 emitter followers by considering each input Ai of equations (1) and (2) as a two input NAND FIG. 6 shows a schematic of such a high density Multi-Emitter 4 input NAND circuit. Again, parallel connected pull-down FET stacks are used to eliminate pull-down switching delay skew.

When several NFETs stacks are paralleled (more than 4) in the pull-down block, fall delay may be impacted. To reduce fall delay according to still another embodiment of the present invention, two (or more) pull-down blocks can be paralleled as shown in FIG. 7.

Figures 7, 8:
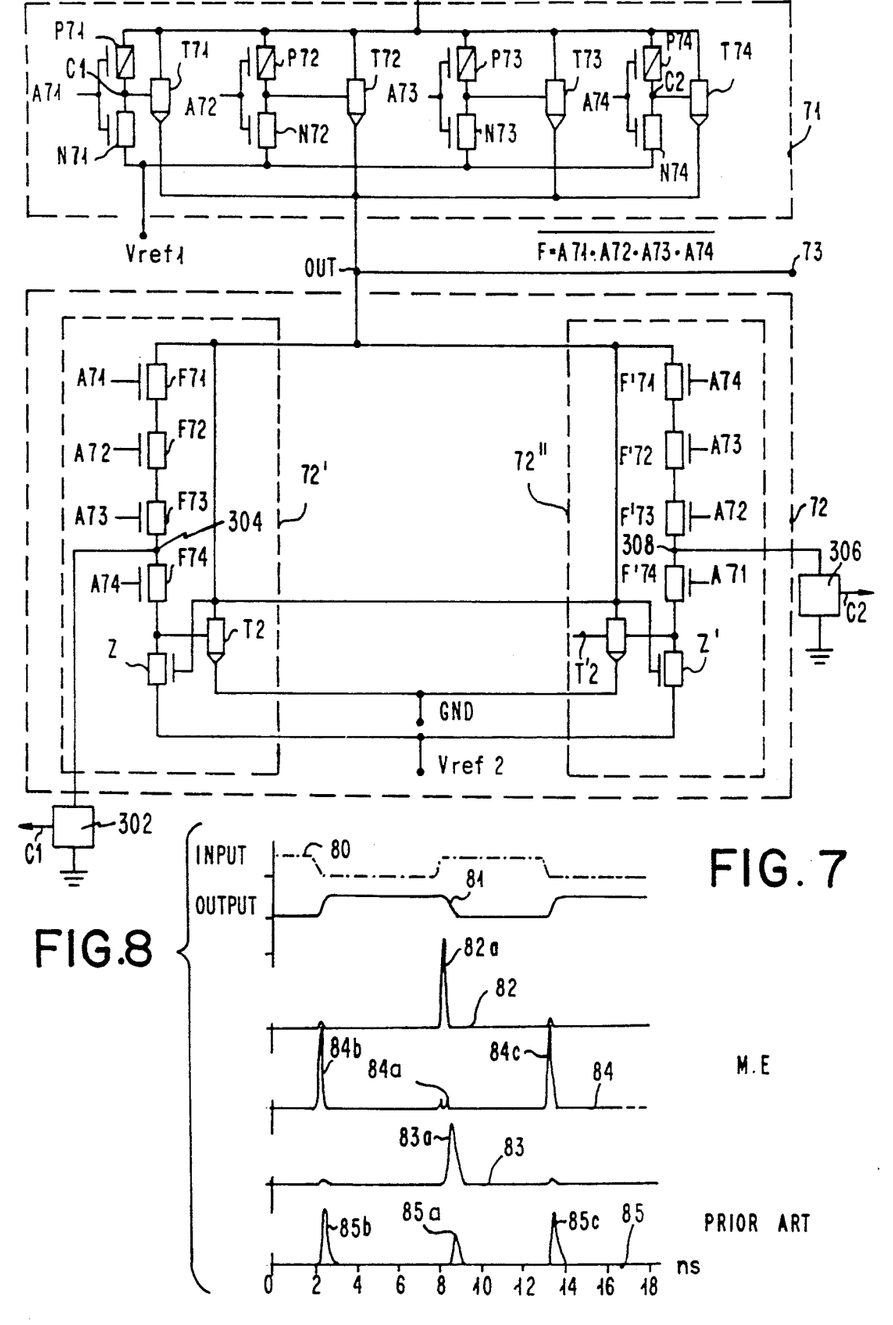
FIG. 7 shows the implementation of a high speed Multi Emitter 4 input NAND circuit with a duplicated pull down block according to still another embodiment of the present invention.
FIG. 8 shows a comparison of the cross over current, between the circuits of the prior art such as depicted in FIGS. 1A and 1B and the circuit of the present invention of FIG. 3.

FIG. 7 shows a 4 input NAND gate circuit 70 performing the logic function F=A74·A72·A73·A74. The pull up block 71 is simply an extension of the pull up block of circuit 30 depicted in FIG. 3. The pull down block 72 in this embodiment uses two exact replicas referenced 72' and 72", which are mounted in parallel to eliminate pull-down switching delay skew. The idea of duplicating twice or more within the pull down block 72, has extensive application. This concept is applied to the circuit shown in FIG. 5, and it significantly improves the performance of the circuit, at the limited cost of a small increase in chip surface area utilization.

The parasitic capacitance discharge circuit shown in FIG. 3 (transistor 300) may be advantageously used in the pull-down blocks 72' and 72" to discharge one or more of the nodes between transistors in the pull-down stacks. By way of example, an NFET 302 is disposed with its drain connected to the node 304 between the NFETs F73 and F74. The source of the NFET 302 is connected to a reference potential such as ground potential. The gate for NFET 302 is connected to node C1, the base of transistor T71. Likewise, an NFET 306 is disposed with its drain connected to the node 308 between the NFETs F'73 and F'74, with its source connected to ground potential, and with its gate connected to the node C2 (the base of transistor T74). These two discharge NFETs effectively discharge the capacitances at the nodes 304 and 308, thereby preventing current glitches in the respective bipolar pull-down transistors T2 and T'2. For more detail on this operation, see the discussion of the discharge NFET 300 of FIG. 3. Note that additional FETs may be provided to discharge other selected nodes between transistors in the respective pull-down stacks, if desired.

It should be understood that a wide variety of different determining logic circuits may be used to implement the gate circuit of the present invention. For example, in the 2 input NAND circuit of FIG. 2, inverter C32 may be replaced by a NOR circuit, with additional appropriate changes in the logic stack. The resulting logic function corresponds to a NOR-NOT.

FIG. 8 shows a comparison of the cross-over current both in conventional and the Multi Emitter BICMOS 2 input NAND circuits. Curves 80 and 81 respectively show the input and output signals Curve 82 shows the current for the multi-emitter pull-down bipolar transistor T2 (FIG. 3) with a current pulse 82a during a pull-down current flow operation Curve 84 shows the current for the multi-emitter pull-up bipolar transistor T31 (FIG. 3) with current pulses 84b and 84c during pull-up operations, and a very small current flow pulse 84a occurring simultaneously with the pull-down pulse 82a for the pull-down bipolar transistor. Accordingly, there is only a negligible cross-over current (when both the pull-down and pull-up bipolar transistors are conducting current simultaneously) and thus a negligible power loss during the pull-down operation.

In contrast, curve 83 shows the current for a prior art pull-down bipolar transistor with a current pulse 83a during a pull-down current flow operation Curve 85 shows the current for a prior art pull-up bipolar transistor with current pulses 85b and 85c during pull-up operations, and a significant current pulse 85a occurring simultaneously with the pull-down pulse 83a for the prior art pull-down bipolar transistor. Accordingly, there is a significant cross-over current when both of the prior art pull-up and pull-down bipolar transistors are conducting simultaneously, and thus a significant power loss during the prior art pull-down operation. This cross-over current power dissipation also detrimentally effects the pull-down switching speed because the additional charge added to the OUT node from the cross-over conduction of the pull-up bipolar must be removed before the voltage of the OUT node can be effectively pulled down.

An additional circuit may be added in order to provide a preferred mode for the pull down circuit.

When the OUT mode of the logic circuit is utilized to drive CMOS transistors it is advantageous to have a pull down circuit that can pull the OUT mode down as low as possible, preferably to ground potential However, where the base of the pull down bipolar transistor is connected to ground via an NFET whose gate is connected to the OUT node, then the base of the pull down bipolar transistor is clamped to Vt, the threshold voltage for the NFET.

Alternatively, if the base of the pull down bipolar transistor is connected to ground through a resistor, this resistor detrimentally affects circuit performance.

Figure 9:
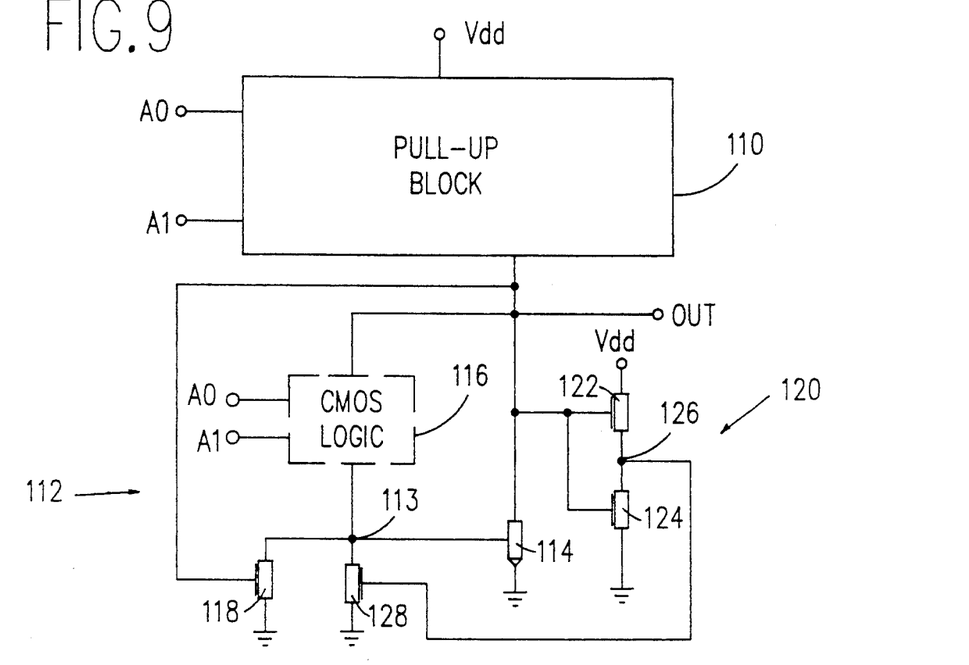
FIG. 9 is a schematic diagram showing one embodiment of the present invention comprising a feedback inverter circuit.

In order to obviate this pull down problem, the circuit of FIG. 9 may be utilized This circuit comprises a standard pull up block 110 for pulling the voltage of the output node OUT up to approximately the reference voltage Vdd when the input signals A0 and A1 have predetermined logic values A pull down circuit 112 is included comprising a pull down bipolar transistor 114 with its collector connected to the OUT node and with its emitter connected to a reference potential such as ground potential. The pull down circuit further includes a CMOS logic block 116 with the logic signal inputs A0 and A1 applied thereto. The logic block 116 is connected between the OUT node and the base terminal 113 of the pull down transistor 114. The pull-down circuit further includes means for holding the pull down bipolar transistor 114 non-conductive when the pull up circuit 110 raises the voltage of the OUT to Vdd. This holding means is implemented by an NFET 118 in FIG. 9, with its drain connected to the base terminal 113 of the bipolar transistor 114, with its source connected to the reference potential, and with its gate appropriately connected to make the NFET 118 conductive to hold the base of the bipolar transistor 114 at the reference potential (ground) when the pull up circuit 110 is holding the OUT node at Vdd. In FIG. 9, the gate for the NFET 118 is connected to the OUT node. Alternatively, it could be connected to the base of a pull up circuit bipolar transistor (if one is utilized).

The improvement resides in the combination of the foregoing circuit with a feedback inverter circuit 120 for discharging the OUT node fully to ground after the majority of the charge on any wiring net connected to the OUT node has been discharged through the bipolar transistor 114 to approximately one Vbe above ground. The feedback inverter 120 comprises an inverter circuit, shown in FIG. 9 as comprising PFET 122 and NFET 124 connected in series between Vdd and ground potential, with their gates connected to the OUT node. A center node 126 located in the series connection between PFET 122 and NFET 124 is connected to control the gate of a transistor 128. The transistor 128, shown in FIG. 9 as an NFET, is disposed with its drain connected to the base of the pull down bipolar transistor 114, and with its source connected to ground potential. When the OUT node drops in potential to approximately one Vbe above ground, NFET 124 becomes non-conductive and PFET 122 becomes conductive, bringing the voltage of node 126 up to Vdd. This rising voltage at node 126 causes the NFET 128 to become conductive, thus discharging the node 113 to ground. If the CMOS logic 116 is functioning to provide a short circuit between the OUT node and node 113 (for example, see F31 and F32 in FIG. 3), then the OUT node fully discharges through the node 113 and the NFET 128 to ground.

In operation of FIG. 9, when the inputs A0 and A1 are such that the pull up block 110 disconnects the OUT node from Vdd (for example, if A31 and A32 in FIG. 3 are both high), and the CMOS logic block 116 connects the OUT node to node 113 (the base of the bipolar transistor 114), then bipolar transistor 114 becomes conductive and discharges the OUT node to one Vbe above ground. At this point, the feedback inverter 120 raises the center node 126 to Vdd, thereby turning on NFET 128. NFET 128 effectively discharges the OUT node to ground via the CMOS logic 116 and the node 113. When the inputs A0 and A1 are such that the pull up block 110 again connects the OUT node to close to Vdd and the CMOS logic block 116 disconnects the OUT node from the node 113, then NFET 118 becomes conductive, to thereby discharge the base of the pull down bipolar transistor 114 and hold it at ground. NFET 118 effectively operates to prevent transistor 114 from faulty switching due to logic noise.

Figure 10:
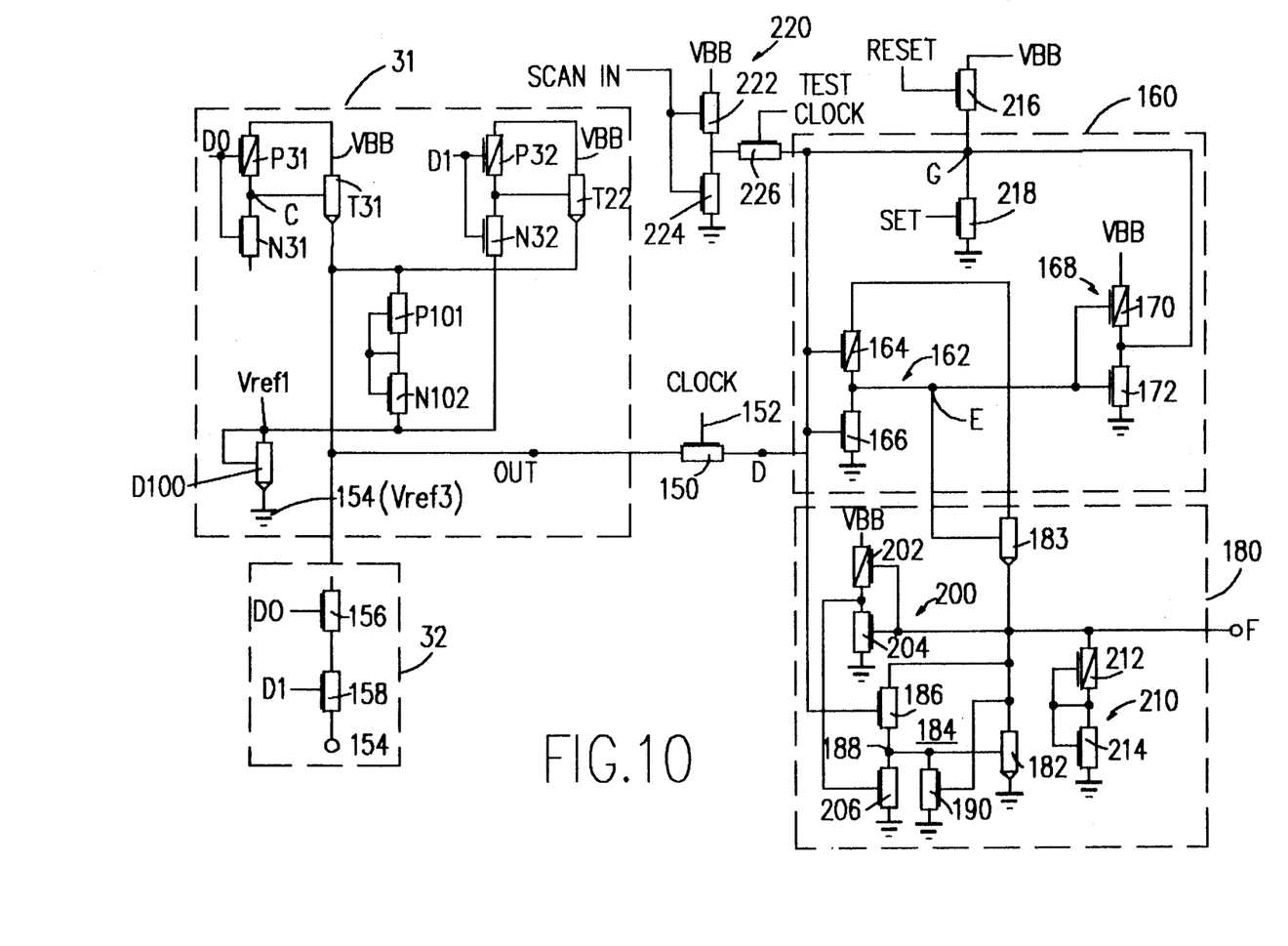
FIG. 10 is a schematic circuit diagram of one embodiment of the present invention.

It has been discovered that when a BICMOS logic gate circuit is used to set a memory circuit, such as a latch, that the switching speed from the data terminals to the output terminal for the latch is improved by at least 15% by substituting one or more FET devices in place of the bipolar pull-down circuit. An embodiment of the present invention implementing this substitution in combination with a latch circuit is shown in FIG. 10. Referring now to FIG. 10, there is shown at least two input terminals D0 and D1, an OUT node, and a pull-up circuit means 31 connected to the at least two input terminals for raising the potential at the OUT node to a first potential when the at least two input terminals have a first set of values. The circuit further includes pull-down circuit means 32 connected to the at least two input terminals for dropping the potential at the OUT node to a second potential which is less than the first potential when the at least two inputs have a second different set of values. The circuit further comprises a node D, a pass gate 150 connected between the OUT node and the D node, with the pass gate 150 controlled by a control signal on the control terminal 152. The circuit also comprises a node E and a memory circuit 160 for storing a voltage level therein and providing an output signal to the node E. The memory circuit 160 is connected to the node D and operates to hold a voltage level therein in accordance with the voltage level at the node D. A voltage is obtained at node D when the pass gate 150 is energized by the control signal on terminal 152 to thereby connect node OUT to node D. The circuit further comprises a node F, and a bipolar driver circuit 180 connected to the node E for driving current through the node F in accordance with the voltage level at the node E.

In essence, the logic gate circuit comprising the pull-up circuit means 31 and the pull-down circuit means 32 is utilized to change the state of the latch circuit 160 and to provide an output signal indicative of the voltage level held in the latch 160 at a node F The most critical delay in most logic circuit-latch configurations is the delay in transferring the voltage level value at the OUT node through the pass gate 150 to the output node F. The delay in this voltage level transfer is a measure of how quickly the data can be latched so that the control signal (clock) on line 152 applied to the pass gate 150 can become inactive. From a review of the circuit, it can be seen that the pass gate transistor 150 will turn on and pass the voltage level at the OUT node when the voltage difference between the control line 152 of the pass gate and the OUT node or the D node reaches and exceeds a threshold. When the threshold voltage difference is reached at the pass gate, then the pass gate transistor 150 becomes conductive so that the OUT node is essentially connected to the node D.

It can be seen that this pass gate switching operation when the voltage level at the OUT node is LOW, is directly affected by the degree to which the OUT node is pulled down. If the OUT node is pulled down to a reference potential voltage Vref3, for example ground potential, then the control line 152 for the pass gate transistor 150 only needs to rise to the threshold voltage for the FET 150, which is approximately 0.6 volts. In contrast, if the pull-down circuit 32 substitutes for the FETs 156 and 157 a bipolar transistor with its collector connected to the OUT node, with its emitter connected to the third reference potential (ground), and with its base terminal connected to be biased into conduction when a second set of values is at the input terminals D0 and D1, then the OUT node will drop initially only to 0.6V, rather than 0 volts because of the slow discharge time constant for the base of the bipolar pull-down transistor. In this instance, the pass gate transistor 150 only becomes conductive when the control signal on the control line 152 rises to a voltage equal to the FET threshold voltage +0.6 volts. An additional factor is that such a bipolar pull-down transistor is initially non-conductive, so that the pull-down operation requires that the base node for this bipolar pull-down transistor must first rise to Vbe before the bipolar pull-down transistor becomes conductive and pull the OUT node down in voltage. These two factors cause a delay penalty in this logic gate latch configuration.

The present invention in one embodiment utilizes in place of the pull-down bipolar transistor at least one FET in the pull-down circuit means 32 connected between the OUT node and the reference voltage Vref3 (ground), with the at least one FET connected to one of the at least two terminals D0 or D1. In the embodiment shown in FIG. 10, the pull-down circuit comprises at least two FETs 156 and 158 connected in series between the OUT node and the third reference potential node 154. The input D0 is applied to the gate terminal of the NFET 156, while the input D1 is applied to the gate terminal of the NFET 158 This FET configuration in the pull-down circuit means 32 ensures that when the OUT node is to be pulled down in voltage, that the OUT node is pulled down essentially to the third reference voltage 154, i.e., ground potential. Accordingly, the control signal 152 for the gate transistor 150 only needs to rise to its threshold voltage in order to make it conductive. This operation quickly overpowers the signal at node D and sets the memory latch circuit 160 in accordance with the voltage level at the OUT node.

A variety of different circuits can be utilized to implement the pull-up circuit means 31 in FIG. 10. In a preferred embodiment, the multi-emitter pull-up circuit is utilized. This circuit has been described in detail with respect to FIG. 3, and thus will not be described in any detail at this point. However, note that in a preferred embodiment the first reference voltage generating circuit for generating the voltage at the node Vref1 includes the diode D100 connected between the Vref1 node and the Vref3 node, and variable resistance means connected between the OUT node and the Vref1 node for providing a resistance that changes proportionally to changes in the potential at the OUT node. In the embodiment shown in FIG. 10, this variable resistance means comprises the PFET 101 and NFET N102 connected in series between the OUT node and the Vref1 node, with the PFET and the NFET devices connected together at a common node, with the respective gates of the PFET and the NFET being connected to this common node.

The memory circuit 160 may, of course, be implemented in a variety of different configurations. In one preferred embodiment of this memory configuration, there is utilized at least one first inverter 162 with its input connected to the node D and operating to provide an inverted signal to node E, and at least one second inverter 164 with its input connected to the node E for inverting the signal at node E and providing that inverted node E signal to the node D. In the embodiment shown in FIG. 10, the at least one first inverter 162 comprises a CMOS inverter formed by a PFET 164 and a NFET 166 connected in series between a power supply voltage VBB and a reference potential. The gates of the PFET 164 and the NFET 166 are connected to the node D. The common node between the series connected PFET 164 and the NFET 166 is connected to the node E. Likewise, the at least one second inverter circuit 168 is implemented by a CMOS inverter comprising a PFET 170 and an NFET 172 connected in series between a power supply voltage VBB and a reference potential. The respective gates of the PFET 170 and the NFET 172 are connected to the node E, while the common node between the PFET 170 and the NFET 172 is connected to the node D.

The bipolar driver circuit 180 in the Figure may also be implemented by a variety of different circuits. In the preferred embodiment shown in FIG. 10, a pull-up circuit block with its input connected to the node E and with the output connected to the node F is utilized for raising the potential at the node F to a first potential when the node E has a first range of values The bipolar driver circuit further includes pull-down circuit means including a bipolar transistor 182 with its collector connected to the node F, and an FET circuit 184 connected to the node D for generating a voltage to bias the base of the bipolar transistor 182 into conduction to pull-down the potential of the node F to a second potential when the node D has a second range of values In the embodiment shown in FIG. 10, the pull-up circuit block comprises simply a bipolar transistor 183, with its collector connected to a power supply VBB, with its emitter connected to the node F, and with its base connected to the node E. This pull-up transistor 183 operates to translate the voltage at the node E down by one VBE voltage drop to the node F, while driving current through the node F.

The FET circuit 184 in the pull-down circuit means may be conveniently implemented by an NFET 186, connected between node F and the base terminal node 188 for the bipolar transistor 182, in combination with an NFET transistor 190 connected between the base terminal node 188 and a reference potential. The gate terminal for the NFET 186 is connected to the node D, while the gate terminal for the NFET 190 is connected to the node F.

The operation of the pull-down circuit means is as follows. When the OUT node is LOW, and when that value has been applied to the node D via the pass gate 150, then the first inverter circuit 162 converts that LOW value to a HIGH value at node E. This HIGH value at node E is translated down by one VBE drop to the node F. With the node D at a LOW voltage level, the NFET 186 is non-conductive. However, because the node F is at a HIGH value, the NFET 190 is biased into conduction, thereby holding the base node 188 for the pull-down bipolar transistor 182 in a non-conductive state.

When the OUT node switches to a HIGH voltage level, and when this voltage level is passed by the pass-gate 150 to the node D, then the first inverter circuit 162 converts this voltage level to a LOW voltage level at the node E. The HIGH voltage at the node D causes the NFET 186 to become conductive, so that charge flows from the node F through the NFET 186 to the base of the bipolar transistor 182. The HIGH voltage potential at the gate of the NFET 186 is translated down to the base node 188 for the bipolar pull-down transistor 182, thereby making that transistor conductive. The bipolar pull-down transistor 182 accordingly quickly removes the majority of the charge from the node F. This operation drops the node F down from its HIGH potential (the first potential) to the second potential which is less than the first potential. With the node F at a LOW voltage level, the NFET 190 is non-conductive. Due to the slow discharge time constant for the base-emitter junction of the bipolar transistor 182, the node F will drop initially only to approximately 0.7 volts. As noted previously, it is advantageous to add a means for dropping the potential of the node F to a third potential which is less than the second potential, in response to an operative control signal. This circuit would include feedback means connected to the node F for generating the operative control signal when the node F drops to the second potential. In the embodiment shown in FIG. 10, the feedback means is implemented by an inverter circuit 200, comprising a PFET transistor 202 and a NFET transistor 204 connected in series between a power supply line VBB and a reference potential. The gates of the PFET 202 and the NFET 204 are connected to the node F. The common terminal between the series connected PFET 202 and the NFET 204 provides the inverted signal to the potential dropping means in the circuit. In the embodiment shown in FIG. 10, the potential dropping means comprises a transistor 206 with its control terminal connected to receive the inverted control signal from the feedback means 200. This transistor 206 may be conveniently implemented by an NFET connected between the base node 188 of the bipolar transistor 182 and a reference potential.

It can be seen that for the situation where the node F is being pulled down by the bipolar transistor 182, that the node D is at the HIGH potential level, while the node F is moving to a LOW potential level. Accordingly, the NFET transistor 186 is conducting Likewise, because the LOW potential at the node F has been inverted by the feedback means 200, the NFET 206 is also conducting. Accordingly, the remaining charge on the node F during this pull-down operation is discharged through the NFET 186 and the NFET 206 to the reference potential.

Figure 11:
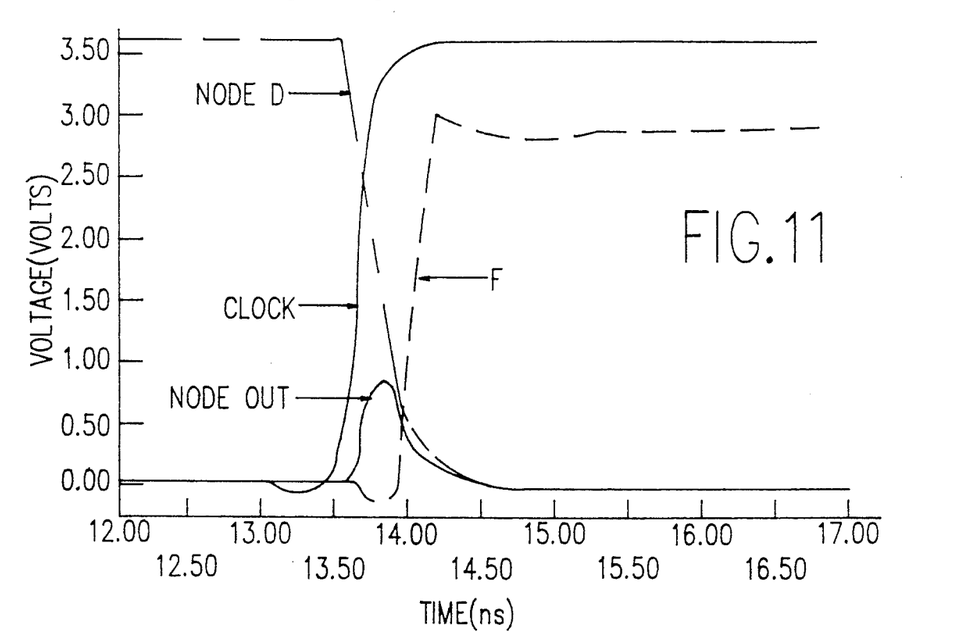
FIG. 11 is a voltage vs time graph for the embodiment shown in FIG. 10.

FIG. 11 is a graph in volts vs ns of the various nodes of the latch circuit of FIG. 10. The curve labeled node OUT corresponds with the node OUT response. Likewise, the curves labeled node D, CLOCK, and Node F, correspond with the circuit responses for the nodes D, CLOCK, and F, respectively. It can be seen that the node D curve falls rapidly, and continues to fall continuously from the 1.00 voltage level to approximately the 0.00 voltage level. This response is in direct contrast to that in the prior art, which has a much slower fall (more than 5 ns) to the 0.00 voltage level. This faster voltage level fall to 0.00 volts reduces the delay of the output signal at node F. Note that the prior art delay causes a current to be drawn in the various devices in the circuit for an unusually long time, thereby increasing latch power dissipation. Note that there is a small voltage pulse in the node OUT curve when the CLOCK curve goes HIGH and when node D is initially HIGH. This small voltage pulse is due to the influx of charge from the node D bringing node OUT up in voltage momentarily, before the charge is drained by the NFETs to ground.

The circuit of FIG. 10 further includes a variable resistance 210 connected between node F and a reference potential. In the example circuit, the variable resistance 210 is implemented by a PFET 212 and an NFET 214 connected in series between node F and ground potential, with the gates of these two devices connected to the common point between PFET 212 and NFET 214. The purpose of this variable resistance 210 is to draw a specific amount of current at node F to ensure that the UP level is not determined by leakage currents.

The circuit of FIG. 10 may include a RESET PFET 216 connected between the power supply VBB and a node G in the latch 160, and a SET NFET 218 connected between the node G and ground potential. Finally, the circuit of FIG. 10 may include a SCAN IN test circuit 220 for applying a test signal to the node D. The test signal can be applied via an inverter comprising a PFET 222 and an NFET 224 and a pass-gate 226 controlled by a TEST CLOCK signal.

The circuit of FIG. 10 significantly improves the critical delay in latching data from node OUT to node F. In essence, this delay is a measure of how long the clock at line 152 must remain HIGH.

While the present invention has been particularly shown and described with reference to preferred embodiments therefor, it will be understood by those skilled in the art that the foregoing and other changes in form and detail may be made therein without departing from the spirit and scope of the present invention.

We claim:

1. A BICMOS logic circuit comprising:
   at least two input terminals (A1, Ai, An);
   an OUT node (23);
   pull-up circuit means (21) connected to said at least two input terminals for raising the potential at said OUT node to a first potential when said at least two inputs have a first set of values;
   pull-down circuit means (22) connected to said at least two input terminals for dropping the potential at said OUT node to a second potential which is less than said first potential when said at least two inputs have a second different set of values;
   wherein said pull-up circuit (21) means comprises n basic cells, IEFi, each having a node C, with each cell implemented primarily with a CMOS determining logic circuit (Ci) connected to at least one of said at least two input terminals for generating a CMOS logic voltage at said node C in accordance with the value of the signal on said at least one input terminal, and with each cell including a bipolar pull-up transistor (Ti) connected as an emitter follower with its base connected to said node C to receive said CMOS logic voltage, wherein the emitters of said emitter follower bipolar transistors of said basic cells are tied together to said OUT node (23) to perform an OR function with the emitter follower signals.

2. A BICMOS logic circuit as defined in claim 1 wherein each of said CMOS determining logic circuits includes at least one CMOS inverter circuit comprising a first FET (P31) of one conductivity type connected between a first power supply (Vdd) and said node C, and a first FET (N31) of an opposite conductivity type to said one conductivity type connected between said node C and a first reference voltage node Vref1, wherein both of said first FETs are connected to the same input terminal.

3. A BICMOS logic circuit as defined in claim 2, wherein at least two of said CMOS determining logic circuits are different.

4. A BICMOS logic circuit as defined in claim 2, wherein said CMOS determining logic circuit is selected from the group of logic gates comprising
   an inverter gate, a NOR gate, and a NAND gate.

5. A BICMOS logic circuit as defined in claim 2, wherein there are at least two identical pull-down circuit means (72', 72") connected in electrical parallel.

6. A BICMOS logic circuit as defined in claim 2, wherein said pull-down circuit means (22) includes a bipolar pull-down transistor (T2) connected between said OUT node and ground potential, and wherein ground potential < first reference voltage and
first reference voltage < ground potential +2 Vbe for the emitter follower.

7. A BICMOS logic circuit as defined in claim 6, wherein said pull-down circuit means (22) comprises discharge means (Z) connected between the base terminal of said bipolar pull-down transistor (T2) and a second reference voltage (Vref2) and with a control terminal connected to said OUT node (23), for discharging said base terminal of said bipolar pull-down transistor (T2) when said OUT node (23) is raised to said first potential, wherein ground potential < second reference voltage and
second reference voltage < (Ground potential + the Vbe for said bipolar pull-down transistor).

8. A BICMOS logic circuit as defined in claim 2, further comprising a first reference voltage generating circuit for generating the voltage at said Vref1 node, comprising a third reference voltage node Vref3;
a diode (D100) connected between said Vref1 node and said Vref3 node; and
variable resistance means (P101, N101) connected between said OUT node and said Vref1 node for providing a resistance that changes proportionally to changes in the potential at said OUT node.

9. A BICMOS logic circuit as defined in claim 8, wherein said variable resistance means comprises a PFET (P101) and an NFET (N102) connected in series between said OUT node and said Vref1 and connected together at a common node, with the respective gates of said PFET and said NFET connected to said common node.

10. A BICMOS logic circuit as defined in claim 2, further comprising a second FET (P62) of said one conductivity type connected in parallel with said first FET of said one conductivity type between said first power supply and said node C, said second FET of said one conductivity type having its gate connected to a different input terminal (A62) than said gate of said first FET of said one conductivity type.

11. A BICMOS logic circuit as defined in claim 10, further comprising a second FET (N62) of said opposite conductivity type connected in series between said first FET (N61) of said opposite conductivity type and said first reference voltage node Vref1, said second FET of said opposite conductivity type having its gate connected to the same input terminal (A62) as the gate of said second FET of said one conductivity type.

12. A BICMOS logic circuit as defined in claim 2, further comprising a second FET (P42, P52) of said one conductivity type connected in series between said first power supply (Vdd) and said first FET (P41, P51) of said one conductivity type, said second FET of said one conductivity type having its gate connected to a different input terminal (A42, A52) from said gate of said first FET of said one conductivity type.

13. A BICMOS logic circuit as defined in claim 12, further comprising a second FET (N42, N52) of said opposite conductivity type connected in parallel to said first FET (N41, N51) of said opposite conductivity type, said second FET of said opposite conductivity type having its gate connected to the same input terminal as the gate of said second FET of said one conductivity type.

14. A BICMOS logic circuit as defined in claim 1, further comprising means (128) for dropping the potential of said OUT node (23) to a third potential which is less than said second potential in response to an operative control signal; and
feedback means (120) connected to said OUT node for generating said operative control signal when said OUT node drops to said second potential.

15. A BICMOS logic circuit as defined in claim 14, wherein said feedback means (120) comprises an inverter circuit.

16. A BICMOS logic circuit as defined in claim 15, wherein said pull-down circuit means includes a bipolar transistor (114) connected to remove charge from said OUT node when conducting, and a logic block (116) connected to said at least two inputs for providing a current path from said OUT node to the base of said bipolar transistor (114) to bias said bipolar transistor (114) into conduction when said at least two inputs have said second set of values; and wherein said third potential dropping means comprises a transistor (128) with its control terminal connected to receive said control signal from said feedback means, and connected to said base of said bipolar transistor for removing charge from said OUT node when said at least two inputs have said second set of values.

17. A BICMOS logic circuit as defined in claim 2, wherein said pull-down circuit means comprises a third reference voltage node Vref3;
a bipolar pull-down transistor (T2) with its collector connected to said OUT node and with its emitter connected to said Vref3 node;
at least one upper FET (F31) and one lower FET (F32) connected in series between said OUT node and the base of said bipolar pull-down transistor (T2) with said upper FET (F31) being closer in the electrical series connection to said OUT node than said lower FET (F32), with said upper and lower FETs connected together at a common node B, with the gate of said upper FET (F31) being connected to one of said at least two input terminals, while the gate of said lower FET is connected to another of said at least two input terminals; and
means (300) controlled by the inverse of said one input of said at least two input terminals for discharging said node B to said Vref3 node when the level of said one input has a predetermined value.

18. A BICMOS logic circuit as defined in claim 17, wherein said node B discharging means (300) is connected to and controlled by the voltage at said node C of the basic cell of said pull-up circuit wherein said one input is inverted.

19. A BICMOS logic circuit as defined in claim 18, wherein said discharging means (300) connected to node B comprises a transistor with its control terminal connected to said node C.

20. A BICMOS logic circuit as defined in claim 1, wherein said pull-down circuit means comprises at least one FET (156) connected between said OUT node and a third reference voltage Vref3, with said at least one FET connected to one of said at least two input terminals; and further comprising
a node D;
a pass gate (150) connected between said OUT node and said node D, said pass gate being controlled by a control signal;
a node E;
a memory circuit (160) for storing a voltage level therein and providing an output signal to node E, said memory circuit connected to said node D and operating to set a voltage level therein in accordance with the voltage level at said node OUT when said pass gate is energized by said control signal;
a node F; and
bipolar driver circuit means (180) connected to said node E for driving current through said node F in accordance with the voltage level at said node E.

21. A BICMOS logic circuit as defined in claim 20, wherein said pull-down circuit means comprises at least two FETs (156, 158) connected in series between said OUT node and said third reference voltage Vref3, with said at least two FETs connected to different ones of said at least two input terminals.

22. A BICMOS logic circuit as defined in claim 20, wherein each of said CMOS determining logic circuits includes at least one CMOS inverter circuit comprising a first FET (P31) of one conductivity type connected between a first power supply and said node C, and a first FET (N31) of an opposite conductivity type to said one conductivity type connected between said node C and a first reference voltage node Vref1, wherein both of said first FETs are connected to the same input terminal.

23. A BICMOS logic circuit as defined in claim 22, further comprising a first reference voltage generating circuit for generating the voltage at said Vref1 node comprising
a third reference voltage node, Vref3;
a diode (D100) connected between said Vref1 node and said Vref3 node; and
variable resistance means (P101, N102) connected between said OUT node and said Vref1 node for providing a resistance that changes proportionally to changes in the potential at said OUT node.

24. A BICMOS logic circuit as defined in claim 23, wherein said variable resistance means comprises a PFET (P101) and an NFET (N102) connected in series between said OUT node and said Vref1 and connected together at a common node, with the respective gates of said PFET and said NFET connected to said common node.

25. A BICMOS logic circuit as defined in claim 20, wherein said bipolar driver circuit means comprises
a pull-up circuit block (183) with its input connected to said node E and with its output connected to said node F for raising the potential at said node F to a fourth potential when said node E has a first range of values; and
pull-down circuit means including a bipolar transistor (182) with its collector connected to said node F, and an FET circuit (186) connected to said node D for generating a voltage to bias the base of said bipolar transistor into conduction to pull-down the potential at said node F to a fifth potential when said node D has a second range of values.

26. A BICMOS logic circuit as defined in claim 25, wherein said bipolar driver circuit means further comprises:

means for dropping (206) the potential of said node F to a sixth potential which is less than said fifth potential in response to an operative control signal, and
feedback means (200) connected to said node F for generating said operative control signal when said node F drops to said fifth potential.

27. A BICMOS logic circuit as defined in claim 26, wherein said feedback means (200) comprises an inverter circuit.

28. A BICMOS logic circuit as defined in claim 27, wherein said FET circuit (186) in said pull-down means for said bipolar driver circuit means (180) operates to connect the base of said bipolar transistor (182) therein to said node F when said node D has said second range of values; and
wherein said potential dropping means comprises a transistor (206) with its control terminal connected to receive said control signal from said feedback means, said transistor connected to said base of said bipolar transistor (182) for removing charge from said node F when said node F drops to said fifth potential.

29. A BICMOS logic circuit as defined in claim 27, wherein said memory circuit (160) comprises at least one first inverter circuit means (162) connected to said node D and providing an inverted signal to said node E, and at least one second inverter circuit means (168) connected to said node E for inverting the signal at said node E and providing said inverted node E signal to said node D.

30. A BICMOS logic circuit as defined in claim 20, wherein said memory circuit (160) comprises at least one first inverter circuit means (162) connected to said node D and providing an inverted signal to said node E, and at least one second inverter circuit means (168) connected to said node E for inverting the signal at said node E and providing said inverted node E signal to said node D 31. A BICMOS logic circuit comprising.
at least two input terminals (A0, A1);
an OUT node;
pull-up circuit means (110) connected to said at least two input terminals for raising the potential at said OUT node to a first potential when said at least two inputs have a first set of values;
pull-down circuit means (112) connected to said at least two input terminals for dropping the potential at said OUT node to a second potential which is less than said first potential when said at least two inputs have a second different set of values;
means (128, 114) for dropping the potential of said OUT node to a third potential which is less than said second potential in response to an operative control signal; and
feedback means (120) connected to said OUT node for generating said operative control signal when said OUT node drops to said second potential.

32. A BICMOS logic circuit as defined in claim 31, wherein said feedback means (120) comprises an inverter circuit.

33. A BICMOS logic circuit as defined in claim 32, wherein said pull-down circuit means includes a bipolar transistor (114) connected to remove charge from said OUT node when conducting; and a logic block (116) connected to said at least two inputs for providing a current path from said OUT node to the base of said bipolar transistor to bias said bipolar transistor into conduction when said at least two inputs have said second set of values; and wherein said third potential dropping means comprises a transistor (128) with its control terminal connected to receive said control signal from said feedback means, and connected to said base of said bipolar transistor for removing charge from said OUT node when said at least two inputs have said second set of values.

34. A BICMOS logic circuit comprising:
at least two input terminals (A31, A32);
an OUT node (33);
pull-up circuit means (31) connected to said at least two input terminals for raising the potential at said OUT node to a first potential when said at least two inputs have a first set of values;
pull-down circuit means (32) connected to said at least two input terminals for dropping the potential at said OUT node to a second potential which is less than said first potential when said at least two inputs have a second different set of values; wherein said pull-down circuit means comprises
a reference voltage node Vref3;
a bipolar pull-down transistor (T2) with its collector connected to said OUT node and with its emitter connected to said Vref3 node;
at least one upper FET (F31) and one lower FET (F32) connected in series between said OUT node and the base of said bipolar pull-down transistor (T2) with said upper FET (F31) being closer in the electrical series connection to said OUT node than said lower FET (F32), with said upper and lower FETs connected together at a common node B, with the gate of said upper FET being connected to one of said at least two input terminals, while the gate of said lower FET is connected to another of said at least two input terminals; and
means (300) controlled by the inverse of said one input of said at least two input terminals for discharging said node B to said Vref3 node when the level of said one input has a predetermined value.

35. A BICMOS logic circuit as defined in claim 34, wherein said discharging means comprises
means (P31, N31) for inverting said one input of said at least two input terminals; and
a transistor (300) with its control terminal connected to the inverted output (C1) of said inverting means, and with its other two terminals connected respectively to said node B and to Vref3.

36. A BICMOS logic circuit comprising:
at least two input terminals (D0, D1);
a node OUT;
a BICMOS pull-up circuit means (31) receiving said at least two inputs and for generating an UP voltage at said node OUT when said at least two inputs have a first set of values;
a series-connected FET pull-down circuit means (32) receiving said at least two inputs and for generating a DOWN voltage at said node OUT which is less than said UP voltage when said at least two input terminals have a second different set of values;
a node D;
a pass gate (150) connected between said nodes OUT and D and controlled by a control signal;
a node E;
means (160) including at least one first inverter circuit means (162) connected to said node D and providing an inverted signal to said node E, at least one second inverter circuit means (168) connected to said node E for inverting the signal at said node E and providing said inverted node E signal to said node D;
a node F; and
bipolar driver circuit means (180) connected to said nodes D and E, said driver circuit means for driving current in said node F in accordance with the signals at said nodes D and E.

37. A BICMOS logic circuit as defined in claim 36 wherein said pull-down circuit means (32) comprises at least two FETs (156, 158) connected in series between said OUT node and a reference voltage Vref3, with said at least two FETs connected to different ones of said at least two input terminals.

38. A BICMOS logic circuit as defined in claim 36 wherein said bipolar driver circuit means comprises
a pull-up circuit block (183) with its input connected to said node E and with its output connected to said node F for raising the potential at said node F to a first potential when said node E has a first range of values; and
pull-down circuit block including a second bipolar transistor (182) with its collector connected to said node F, and an FET circuit (186) connected to said node D for generating a voltage to bias the base of said bipolar transistor (182) into conduction to pull-down the potential at said node F to a second potential when said node D has a second range of values.

39. A BICMOS logic circuit as defined in claim 38 wherein said bipolar driver circuit means further comprises:
means (206) for dropping the potential of said node F to a third potential which is less than said second potential in response to an operative control signal; and
feedback means (200) connected to said node F for generating said operative control signal when said node F drops to said second potential.

40. A BICMOS logic circuit as defined in claim 39, wherein said feedback means (200) comprises an inverter circuit.

41. A BICMOS logic circuit as defined in claim 40 wherein said FET circuit (186) in said pull-down means for said bipolar driver circuit means operates to connect the base of said bipolar transistor therein to said node F when said node D has said second range of values; and
wherein said potential dropping means comprises a transistor (206) with its control terminal connected to receive said control signal from said feedback means, said transistor (206) connected to said base of said second bipolar transistor for removing charge from said node F when said node F drops to said second potential.

42. A BICMOS logic circuit as defined in claim 36 wherein said BICMOS pull-up circuit means comprises n basic cells, IEF$_i$, with each cell implemented with a CMOS determining logic circuit (Ci) connected to at least one of said at least two input terminals for generating a CMOS logic voltage at a node C in accordance with the value of the signal on said at least one input terminal, and with each cell including a bipolar pull-up transistor (T2) mounted as an emitter follower with its base connected to node C, to receive said CMOS logic voltage, wherein the emitters of said emitter follower bipolar transistors of said basic cells are tied together to said OUT node to perform an OR function

43. A BICMOS logic circuit as defined in claim 2, further comprising a first reference voltage generating circuit for generating the voltage at said Vref1 node, comprising a third reference voltage node Vref3;

a diode (D100) connected between said Vref1 node and said Vref3 node; and a plurality of series-connected diodes connected between said OUT node and said Vref1 node for clamping said OUT node voltage.

* * * * *